United States Patent
Hsu et al.

(10) Patent No.: US 11,778,726 B2
(45) Date of Patent: Oct. 3, 2023

(54) HEAT DISSIPATION STRUCTURE HAVING HOUSING MADE OF HIGH THERMAL RESISTANCE MATERIAL AND ELECTRONIC APPARATUS HAVING THE SAME

(71) Applicant: Alpha Networks Inc., Hsinchu (TW)

(72) Inventors: Fu-Hung Hsu, Hsinchu (TW); Hsin-Hong Chen, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 23 days.

(21) Appl. No.: 17/680,341

(22) Filed: Feb. 25, 2022

(65) Prior Publication Data
US 2022/0418084 A1    Dec. 29, 2022

(30) Foreign Application Priority Data
Jun. 24, 2021   (TW) ................................ 110123168

(51) Int. Cl.
*H05K 1/02*     (2006.01)
(52) U.S. Cl.
CPC ................................. *H05K 1/0204* (2013.01)
(58) Field of Classification Search
CPC .......... H05K 7/00; H05K 7/20; H05K 7/1422; H05K 7/2039; H05K 7/2049; H05K 7/20409–20418; H05K 7/20154; H05K 7/20509; H05K 7/209; H05K 7/20927; H05K 1/0201–0204; H05K 1/0209; H05K 1/0212; H05K 2201/10277;
(Continued)

(56) References Cited

U.S. PATENT DOCUMENTS

| | | | | |
|---|---|---|---|---|
| 6,058,014 A | * | 5/2000 | Choudhury | ............ H05K 3/325 439/71 |
| 6,330,167 B1 | * | 12/2001 | Kobayashi | ........... H05K 9/0028 361/801 |

(Continued)

FOREIGN PATENT DOCUMENTS

CN           211127865          7/2020

OTHER PUBLICATIONS

TW OA dated Feb. 25, 2022.

*Primary Examiner* — Amir A Jalali
(74) *Attorney, Agent, or Firm* — WPAT, P.C

(57) ABSTRACT

A heat dissipation structure and an electronic apparatus having the heat dissipation structure are provided. The electronic apparatus includes a printed circuit board, a high thermal-resisting housing, a thermal pad and a metal bracket. Heat is transferred between the thermal pad and an electronic component mounted on the printed circuit board. The high thermal-resisting housing defines an inner space for accommodating the printed circuit board. A columnar space is formed in the high thermal-resisting housing, and a metal layer is arranged outside the columnar space. The thermal conductivity of the high thermal-resisting housing is not greater than 1 W/m·K. The metal bracket and the printed circuit board are disposed at two opposite sides of the high thermal-resisting housing, respectively. A fastening member penetrates through the metal bracket and is inserted into the columnar space to urge the metal bracket to be in contact with the metal layer.

12 Claims, 5 Drawing Sheets

(58) Field of Classification Search
CPC .......... H05K 2201/066; H01L 23/367; H01L 23/3672; H01L 23/3677; H01L 23/40–4006; H01L 23/4093; H01L 23/4081; H01L 23/4087; H01L 23/49827; H01L 23/562; H01L 23/405; H01L 2023/405; H01L 2023/4062; H01L 2023/4037; H01L 2023/4075–4087; G06F 1/20; G06F 1/16; G06F 1/203
See application file for complete search history.

(56) References Cited

U.S. PATENT DOCUMENTS

| | | | |
|---|---|---|---|
| 2006/0044762 A1* | 3/2006 | Kikuchi | H05K 7/209 257/E23.105 |
| 2008/0203559 A1* | 8/2008 | Lee | H01L 23/4006 257/E23.084 |
| 2010/0170714 A1 | 7/2010 | Poidl | |
| 2015/0129401 A1* | 5/2015 | Sanford | H01L 27/1255 200/294 |
| 2015/0303126 A1* | 10/2015 | Takahashi | H01L 23/49894 257/77 |
| 2016/0150655 A1* | 5/2016 | Takenaka | H05K 5/0056 361/709 |
| 2021/0035944 A1* | 2/2021 | Cheng | H01L 23/4006 |

* cited by examiner

HEAT DISSIPATION STRUCTURE HAVING HOUSING MADE OF HIGH THERMAL RESISTANCE MATERIAL AND ELECTRONIC APPARATUS HAVING THE SAME

FIELD OF THE INVENTION

The present disclosure relates to a heat dissipation structure and an electronic apparatus has the heat dissipation structure, and particularly to a heat dissipation structure having a housing made of high thermal resistance material and an electronic apparatus adopting the heat dissipation structure.

BACKGROUND OF THE INVENTION

In an electronic apparatus, charges flow through various circuits to drive the electronic components to perform designated operations. During the operations, more or less heat is unavoidably generated so as to raise the internal temperature. Overtemperature probably affects the operations of the electronic components to cause unexpected accidents. Therefore, the electronic apparatus should ensure heat dissipation to keep normal operation.

To achieve efficient heat dissipation, an electronic apparatus may adopt a metal housing which has high thermal conductivity to expedite the heat dissipation. Such design does not conform to some standards limiting the temperature of the housing of the electronic apparatus. For conforming to the standards, an electronic apparatus adopting a housing (e.g. a plastic housing) made of high thermal resistance material is proposed. Considering the electronic apparatus having a plastic housing, several vents may be provided on the housing to facilitate the heat dissipation. However, the vents are disadvantageous to waterproof applications. Hence, it is desired to provide a heat dissipation structure used with an electronic apparatus having a housing made of high thermal resistance material to meet both requirements of waterproof and efficient heat dissipation.

SUMMARY OF THE INVENTION

An aspect of the present disclosure provides an electronic apparatus having a heat dissipation structure. The electronic apparatus includes a printed circuit board, a high thermal-resisting housing, a thermal pad and a metal bracket. An electronic component is mounted on the printed circuit board. The high thermal-resisting housing defines an inner space for accommodating the printed circuit board. A columnar space is formed in the high thermal-resisting housing wherein a first end of the columnar space is exposed from the high thermal-resisting housing and a second end of the columnar space is enclosed by the high thermal-resisting housing. A metal layer is arranged outside the columnar space. The thermal conductivity of the high thermal-resisting housing is not greater than 1 W/m·K. The thermal pad is disposed between the metal layer and the printed circuit board wherein the thermal pad conducts heat exchange with the metal layer and the electronic component. The metal bracket and the printed circuit board are disposed at two opposite sides of the high thermal-resisting housing, respectively, and a fastening member penetrates through the metal bracket and is inserted into the columnar space through the first end to urge the metal bracket to be in contact with the metal layer.

In an embodiment, the metal layer encloses a wall defining the columnar space and the wall is a portion of the high thermal-resisting housing.

In an embodiment, a portion of the metal layer is disposed between the second end of the columnar space and the thermal pad.

In an embodiment, the fastening member is a screw, and the screw fits the columnar space so as to be locked with the high thermal-resisting housing.

In an embodiment, the thermal pad is in contact with the electronic component and conducts direct contact heat exchange with the electronic component.

In an embodiment, the thermal pad is in contact with the printed circuit board, and the thermal pad conducts heat exchange with the electronic component through the printed circuit board.

In an embodiment, the electronic apparatus further includes a heat conduction plate having a first surface in contact with the thermal pad and a second surface in contact with the electronic component wherein the electronic component conducts heat exchange with the thermal pad through the heat conduction plate.

In an embodiment, the electronic apparatus further includes a supporting member having a first end connected to the printed circuit board and a second end connected to the high thermal-resisting housing to maintain a gap between the printed circuit board and the housing to protect the electronic component arranged in the gap.

Another aspect of the present disclosure provides a heat dissipation structure having a housing made of high thermal resistance material. The heat dissipation structure includes a high thermal-resisting housing, a thermal pad and a metal bracket. The high thermal-resisting housing defines an inner space for accommodating a heat source. A columnar space is formed in the high thermal-resisting housing wherein a first end of the columnar space is exposed from the high thermal-resisting housing and a second end of the columnar space is enclosed by the high thermal-resisting housing. A metal layer is arranged outside the columnar space. The thermal conductivity of the high thermal-resisting housing is not greater than 1 W/m·K. The thermal pad is disposed between the metal layer and the heat source wherein the thermal pad conducts heat exchange with the metal layer and the heat source. The metal bracket and the heat source are disposed at two opposite sides of the high thermal-resisting housing, respectively, and a fastening member penetrates through the metal bracket and is inserted into the columnar space through the first end to urge the metal bracket to be in contact with the metal layer.

BRIEF DESCRIPTION OF THE DRAWINGS

The advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
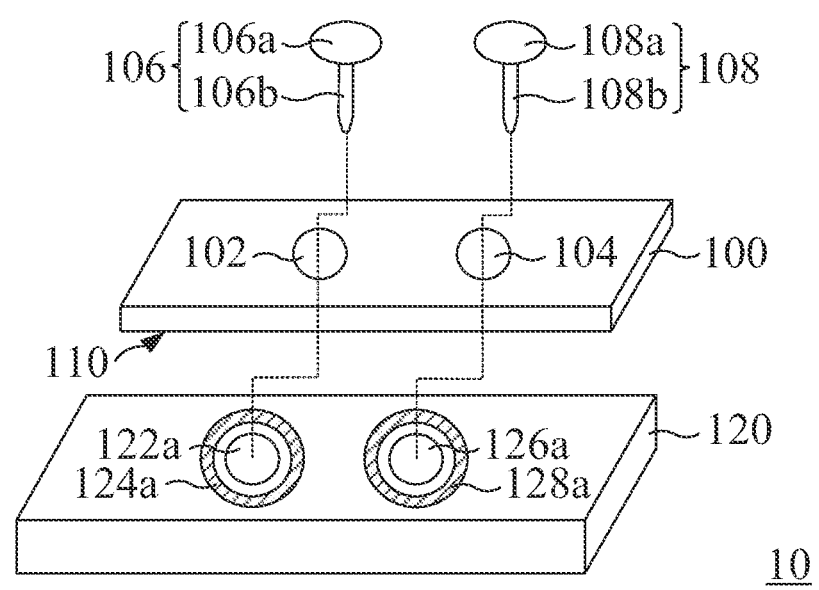
FIG. 1 is an exploded view of a heat dissipation structure having a housing made of high thermal resistance material according to an embodiment of the present disclosure.

Please refer to FIG. 1, which is an exploded view of a heat dissipation structure used with a housing made of high thermal resistance material according to an embodiment of the present disclosure. The high thermal resistance material is defined as that the thermal conductivity is not greater than 1 W/m·K, e.g. plastic. The heat dissipation structure 10 mainly includes a metal bracket 100 and a housing 120. In the embodiment, the housing 120 is a sealed case with protection from dust and water. There is an inner space enclosed by the housing 120 for elements for a particular purpose. The metal bracket 100 is securely connected to the housing 120 by a fastening member 106 (e.g. bolt, screw, pin or rivet). The metal bracket 100 is configured to be secured to a solid structure (e.g. wall or ceiling) so that the housing 120 along with the inner elements is mounted on or fixed to the designated place.

In the diagram, the metal bracket 100 has two holes 102 and 104 for illustration purposes, but the number of the holes is not limited to the embodiment. Two openings 122a and 126a are provided on the housing 120 and at positions corresponding to and aligned with the holes 102 and 104 of the metal bracket 100. Metal layers 124a and 128a are formed to surround outer edges of the openings 122a and 126a. The fastening member 106 penetrates through the hole 102 of the bracket 100 and is further inserted into the corresponding opening 122a of the housing 120. Similarly, the fastening member 108 penetrates through the hole 104 of the bracket 100 and is further inserted into the corresponding opening 126a of the housing 120. The fastening member 106, 108 could be a screw, a rivet or other known fastening member having a head portion 106a, 108a and a tail portion 106b, 108b wherein the head portion 106a, 108a has a greater diameter or cross-sectional area than the tail portion 106b, 108b. A screw is taken as an example in the description, but the present disclosure does not limit the fastening member to the screw. Besides, other type of fastening member, e.g. clamp, could be applied to secure the metal bracket 100 and the housing 120 together. Such modification is not beyond the present disclosure.

To get a better seal, the housing 120 along with the metal layers 124a and 128a could be formed by an insert molding process. It is to be noted that other molding process complying with the product standards is also applicable to the housing.

Figure 2A:
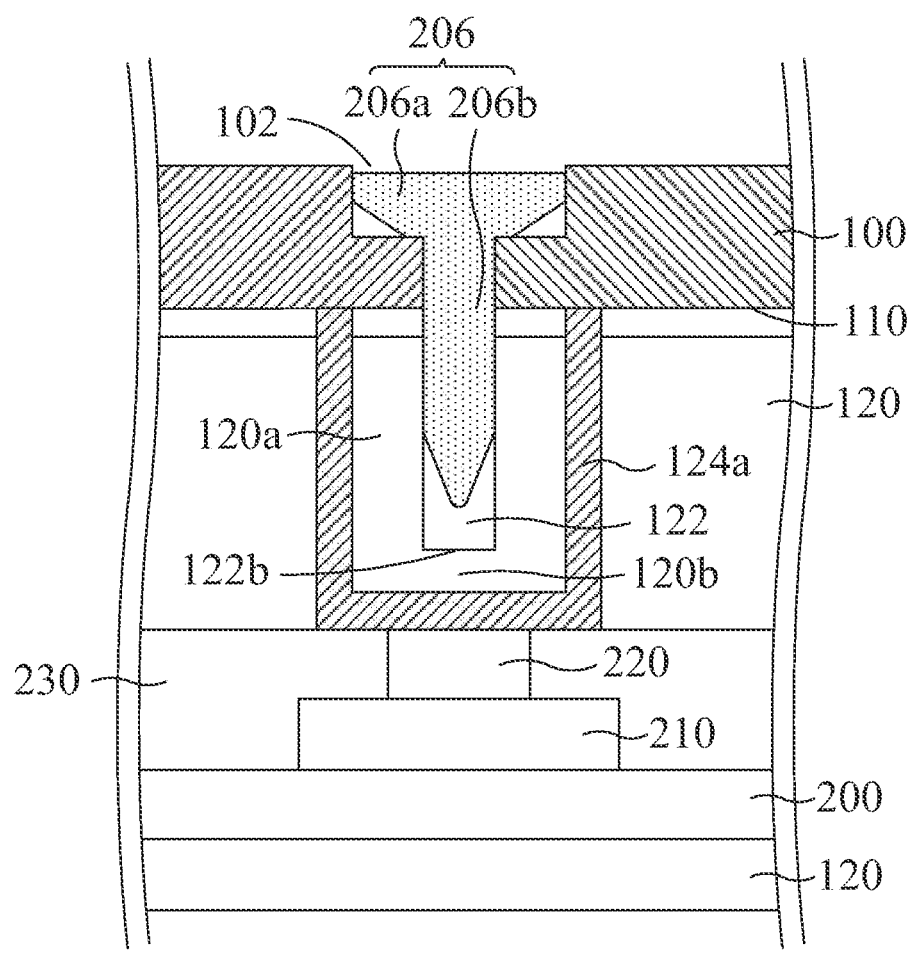
FIGS. 2A-2D are cross-sectional views showing the heat dissipation structure having a housing made of high thermal resistance material wherein an internal heat source is disposed therein according to embodiments of the present disclosure.

Please refer to FIG. 2A, which is a cross-sectional view showing the heat dissipation structure having a housing made of high thermal resistance material wherein an internal heat source is disposed therein according to an embodiment of the present disclosure. The screw 206 is as an example of the fastening member 106 as shown in FIG. 1. In this diagram, the screw 206 penetrates through the hole 102 and is inserted into the columnar space 122. The screw head 206a (i.e. the head portion of the fastening member) could be entirely or partially located within the hole 102. The screw head 206a may taper towards the housing 120. In other words, the diameter or cross-sectional area of the screw head 206a away from the housing 102 is greater than that of the screw head 206a close to the housing 102. The columnar space 122 can entirely or partially accommodate the screw stud 206b (i.e. the tail portion of the fastening member) of the screw 206. One end of the columnar space 122 is exposed from the housing 120 to form the opening 122a shown in FIG. 1. The other end of the columnar space 122, close to the inner space 230, is enclosed by the housing 120 (called bottom wall 120b of the columnar space 122 in the specification) to form an end surface 122b which prevents water, moisture or dust from entering the inner space 230. Furthermore, a thread (not shown), matching with the thread stud 206b, could be formed along the side wall 120a enclosing the columnar space 122 so that the screw 206 could be firmly secured to the housing 120. When the screw 206 is secured to the housing 120, the screw head 206a applies a force to urge the metal bracket 100 toward the housing 120. The force makes the bottom surface 110 of the metal bracket 100 close to or in contact with the outer surface of the housing 120.

To enhance heat dissipation efficiency, heat exchange occurs at several positions. Firstly, a first portion of the metal layer 124a mostly embedded in the housing 120 is exposed from the outer surface of the housing 120. When the metal bracket 100 is close to the housing 120, the first exposed portion of the metal layer 124a is in contact with the metal bracket 100. Thus, heat exchange occurs between the metal layer 124a and the metal bracket 100. Secondly, a second portion of the metal layer 124a is exposed from the inner surface of the housing 120 to reach the inner space 230. Thus, heat exchange occurs between the metal layer 124a and the internal heat source disposed inside the housing 120 in a direct or indirect manner. Therefore, the metal layer 124a absorbs heat from the internal heat source in the inner space 230 and transfers the heat to the metal bracket 100. Then, the heat is dissipated outside through the metal bracket 100. In addition, fins, in any known form, could be provided on the metal bracket 100 to further enhance the heat dissipation efficiency of the heat dissipation structure 10.

The heat dissipation structure could be applied to various apparatuses, particularly to an electronic apparatus having circuit boards, integrated circuit chips and electronic components which are sensitive to or probably affected by dust or moisture. Therefore, the heat dissipation structure in the above embodiment could form a heat-dissipation case of an electronic apparatus. As shown in FIG. 2A, the heat dissipation structure is applied to an electronic apparatus, and the internal heat source is the integrate circuit chip 210. In this diagram, the (printed) circuit board 200 with the integrated circuit chip 210 mounted thereon and the metal bracket 100 are disposed at two opposite sides (i.e. inside and outside) of the housing 120, respectively. The circuit board 200 is disposed in the inner space 230 enclosed by the housing 120. In addition, a thermal pad 220 is disposed between the integrated circuit chip 210 and the metal layer 124a in a direct contact manner. From another view point, the second exposed portion of the metal layer 124a is disposed between the end surface 122b of the columnar space 122 (or the bottom wall 120b) and the thermal pad 220. By such arrangement, the heat generated by the integrated circuit chip 210 is transferred to the metal layer 124a through the thermal pad 220, and then transferred outside through the metal bracket 100. In addition to the role of conducting heat, the thermal pad 220 made of resilient material can buffer the integrated circuit chip 210 or the circuit board 200 against impact or pressure exerted by the housing 120 as the housing 120 is closed to cover the internal components.

Figure 2B:
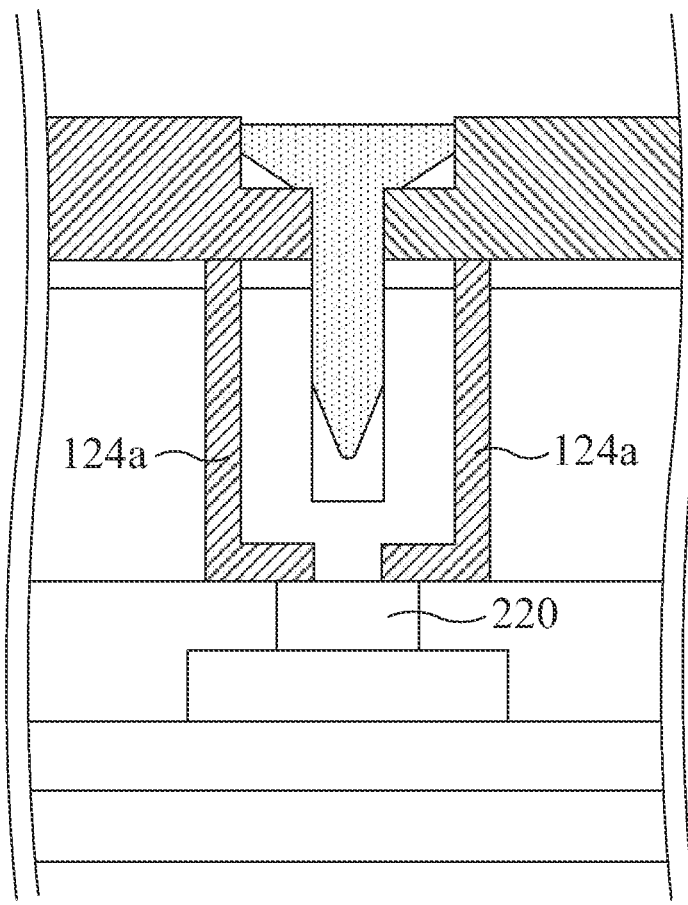

Considering cost reduction, the thermal pad 220 may be disposed just at the position corresponding to or overlapping the integrated circuit chip 210. Also, the metal layer 124a may be disposed just at the position corresponding to or overlapping the thermal pad 220. As shown in FIG. 2B, the bottom wall is not completely enclosed by the metal layer 124a. The area covered by the metal layer 124a could be further reduced on condition that the heat conduction is satisfied according to experiment or calculation result. It can reduce the cost regarding the metal layer 124a.

Figure 2C:
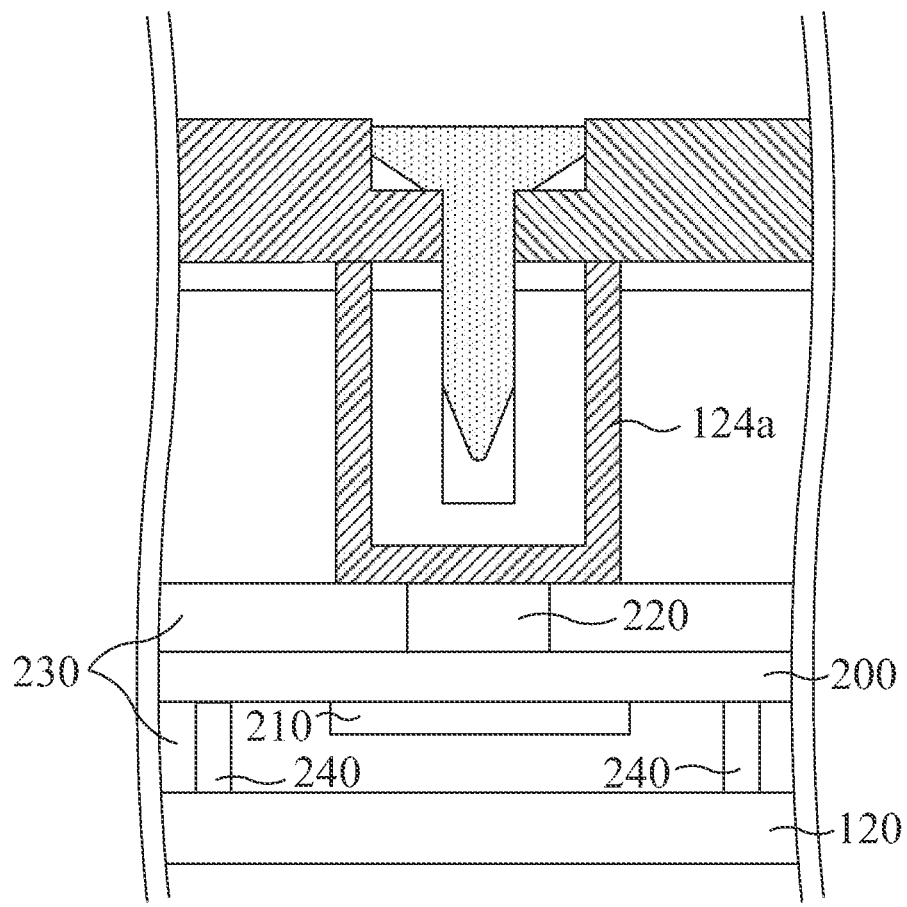

In another embodiment, the orientation of the integrated circuit chip in the electronic apparatus could be modified to decrease the pressure exerted on the integrated circuit chip. As shown in FIG. 2C, the thermal pad 220 and the integrated circuit chip 210 are disposed on two opposite surfaces of the circuit board 200. The thermal pad 220 is in direct contact with the circuit board 200 and at the position corresponding to, aligned with or overlapping the integrated circuit chip 210 to assist in heat dissipation. According to such design, heat generated by the integrated circuit chip 210 is conducted to the thermal pad 220 through the circuit board 200, and then dissipated outside through the metal bracket 100. In this condition, the integrated circuit chip 210 faces the inner space 230. The gap between the integrated circuit chip 210 and the housing 120 may become thinner due to gravity or external squeeze. Thus, at least one supporting member 240 is provided to prevent from possible press on the integrated circuit chip 210. One end of the supporting member 240 is connected to the housing 120 or a mounting rack (not shown), and the other end supports or urges against the circuit board 200 to maintain enough gap therebetween. The supporting member 240 could be made of rigid material or resilient material sufficient to prop up the circuit board 200.

Figure 2D:
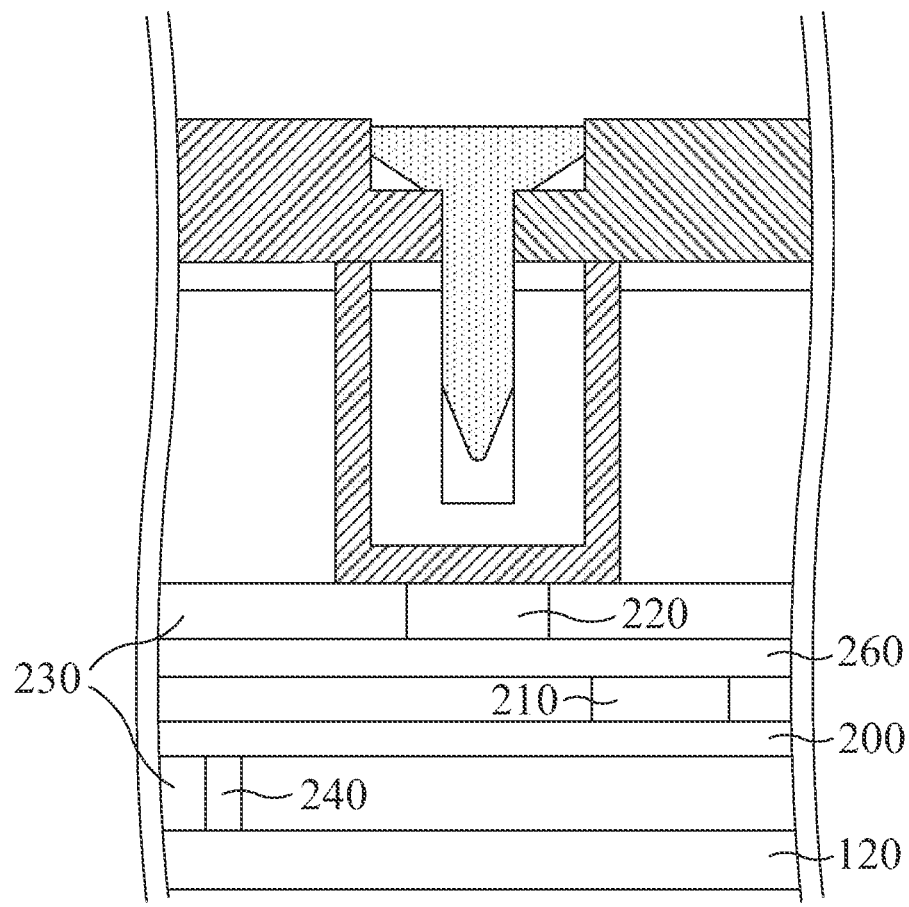

In the above embodiments, it is proposed to dispose the metal layer 124a and the thermal pad 220 at positions corresponding to or aligned with the internal heat source (e.g. integrated circuit chip 210). However, the present disclosure does not limit the arrangement to these embodiments. For example, the positions of the metal layer 124a and the thermal pad 220 need not correspond to the internal heat source (e.g. integrated circuit chip 210). In this condition, the efficiency of heat dissipation may be lowered, but it contributes more design flexibility of the housing structure. Furthermore, a heat conduction plate could be mounted on the circuit board 200 to satisfy concerns of both high design flexibility and rapid heat dissipation. As shown in FIG. 2D, a heat conduction plate 260 is provided in the heat dissipation structure. One surface of the heat conduction plate 260 is in contact with the thermal pad 220, and the opposite surface is in contact with the internal heat source (e.g. the integrated circuit chip 210). Therefore, heat can be transferred between the electronic component and the thermal pad 220 through the heat conduction pad 260 even though they are not disposed at the same position relative to opposite surfaces of the circuit board 200. Also, by adopting the heat conduction plate 260, the positions of the thermal pad 220 and the metal layer 124a need not be in alignment with the internal heat source, and it reduces design and arrangement restriction on the housing 120. Therefore, the present disclosure provides greater flexibility in the design of the housing 120 while keeping the heat dissipation performance of the heat dissipation structure.

In conclusion, the heat dissipation structure having a housing made of high thermal resistance material and the electronic apparatus using the dissipation structure take advantages of an embedded metal layer to efficiently remove out the heat within the housing by heat conduction. The heat dissipation structure of the present disclosure including the sealed housing made of high thermal resistance material and embedded heat conduction medium is waterproof and has the advantage of better heat dissipation efficiency.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic apparatus having a heat dissipation structure, comprising:
   a printed circuit board with an electronic component mounted thereon;
   a high thermal-resisting housing defining an inner space for accommodating the printed circuit board, a columnar space being formed in the high thermal-resisting housing wherein a first end of the columnar space is exposed from the high thermal-resisting housing and a second end of the columnar space is enclosed by the high thermal-resisting housing, a metal layer being arranged outside the columnar space, the thermal conductivity of the high thermal-resisting housing being not greater than 1 W/m–K;
   a thermal pad disposed between the metal layer and the printed circuit board wherein the thermal pad conducts heat exchange with the metal layer and the electronic component; and
   a metal bracket, wherein the metal bracket and the printed circuit board are disposed at two opposite sides of the high thermal-resisting housing, respectively, and a fastening member penetrates through the metal bracket and is inserted into the columnar space through the first end to urge the metal bracket to be in contact with the metal layer,
   wherein the metal layer encloses a wall defining the columnar space and the wall is a portion of the high thermal-resisting housing.

2. The electronic apparatus according to claim 1, wherein a portion of the metal layer is disposed between the second end of the columnar space and the thermal pad.

3. The electronic apparatus according to claim 1, wherein the fastening member is a screw, and the screw fits the columnar space so as to be locked with the high thermal-resisting housing.

4. The electronic apparatus according to claim 1, wherein the thermal pad is in contact with the electronic component and conducts direct contact heat exchange with the electronic component.

5. The electronic apparatus according to claim 1, wherein the thermal pad is in contact with the printed circuit board, and the thermal pad conducts heat exchange with the electronic component through the printed circuit board.

6. The electronic apparatus according to claim 1, further comprising a heat conduction plate having a first surface in contact with the thermal pad and a second surface in contact with the electronic component wherein the electronic component conducts heat exchange with the thermal pad through the heat conduction plate.

7. The electronic apparatus according to claim 1, further comprising a supporting member having a first end connected to the printed circuit board and a second end connected to the housing to maintain a gap between the printed circuit board and the housing to protect the electronic component arranged in the gap.

8. A heat dissipation structure having a housing made of high thermal resistance material, the heat dissipation structure comprising:
- a high thermal-resisting housing defining an inner space for accommodating a heat source, a columnar space being formed in the high thermal-resisting housing wherein a first end of the columnar space is exposed from the high thermal-resisting housing and a second end of the columnar space is enclosed by the high thermal-resisting housing, a metal layer being arranged outside the columnar space, the thermal conductivity of the high thermal-resisting housing being not greater than 1 W/m–K;
- a thermal pad disposed between the metal layer and the heat source wherein the thermal pad conducts heat exchange with the metal layer and the heat source; and
- a metal bracket, wherein the metal bracket and the heat source are disposed at two opposite sides of the high thermal-resisting housing, respectively, and a fastening member penetrates through the metal bracket and is inserted into the columnar space through the first end to urge the metal bracket to be in contact with the metal layer, wherein the metal layer encloses a wall defining the columnar space and the wall is a portion of the high thermal-resisting housing.

9. The heat dissipation structure according to claim 8, wherein a portion of the metal layer is disposed between the second end of the columnar space and the thermal pad.

10. The heat dissipation structure according to claim 8, wherein the fastening member is a screw, and the screw fits the columnar space so as to be locked with the high thermal-resisting housing.

11. The heat dissipation structure according to claim 8, wherein the thermal pad is in contact with the heat source and conducts direct contact heat exchange with the heat source.

12. The heat dissipation structure according to claim 8, further comprising a heat conduction plate having a first surface in contact with the thermal pad and a second surface in contact with the heat source wherein the heat source conducts heat exchange with the thermal pad through the heat conduction plate.

* * * * *